(12) United States Patent
Marotta

(10) Patent No.: US 7,238,981 B2
(45) Date of Patent: Jul. 3, 2007

(54) METAL-POLY INTEGRATED CAPACITOR STRUCTURE

(75) Inventor: Giulio Giuseppe Marotta, Via Fontecerro (IT)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 10/921,463

(22) Filed: Aug. 19, 2004

(65) Prior Publication Data

US 2006/0039208 A1 Feb. 23, 2006

Related U.S. Application Data

(62) Division of application No. 10/228,823, filed on Aug. 27, 2002, now Pat. No. 6,897,511.

(30) Foreign Application Priority Data

Aug. 29, 2001 (IT) .......................... RM2001A0517

(51) Int. Cl.
*H01L 27/108* (2006.01)

(52) U.S. Cl. ................ 257/307; 257/535; 257/E27.016

(58) Field of Classification Search ................ 257/296, 257/299, 300, 307, 311, 532, 535, 536, E27.024, 257/E27.025, E27.033, E27.034, E27.048, 257/E27.016; 327/535, 536; 365/226, 189.09, 365/225.7
See application file for complete search history.

(56) References Cited

U.S. PATENT DOCUMENTS

| | | | |
|---|---|---|---|
| 5,234,855 A | 8/1993 | Rhodes | |
| 5,583,359 A * | 12/1996 | Ng et al. | ..................... 257/306 |
| 6,240,033 B1 * | 5/2001 | Yang et al. | .............. 365/225.7 |
| 6,385,033 B1 | 5/2002 | Javanifard | |
| 6,410,955 B1 | 6/2002 | Baker | |
| 6,509,245 B2 | 1/2003 | Baker | |
| 2002/0120937 A1 | 8/2002 | Chang | |

* cited by examiner

*Primary Examiner*—Minhloan Tran
*Assistant Examiner*—Benjamin Tzu-Hung Liu
(74) *Attorney, Agent, or Firm*—Leffert Jay & Polglaze, P.A.

(57) ABSTRACT

A metal-poly integrated capacitor structure that may be used in a charge pump circuit of a non-volatile memory. In one embodiment, the capacitor comprises a poly silicon layer, a first metal layer and a second metal layer. The first metal layer is positioned between the poly silicon layer and the second metal layer. The first metal layer has a first terminal and a second terminal. The first terminal is electrically isolated from the second terminal.

13 Claims, 6 Drawing Sheets

METAL-POLY INTEGRATED CAPACITOR STRUCTURE

RELATED APPLICATIONS

This is a divisional application of U.S. patent application Ser. No. 10/228,823, titled "METAL-POLY INTEGRATED CAPACITOR STRUCTURE," filed Aug. 27, 2002 now U.S. Pat. No. 6,897,511, which application is assigned to the assignee of the present invention and the entire contents of which are incorporated herein by reference, and which application claims priority to Italian Patent Application Serial No. RM2001A000517, filed Aug. 29, 2001, of the same title.

TECHNICAL FIELD OF THE INVENTION

The present invention relates generally to capacitors and in particular the present invention relates to a metal-poly integrated capacitor structure that may be used in a charge pump circuit of a non-volatile memory.

BACKGROUND OF THE INVENTION

A flash memory is a type of non-volatile memory. That is, a flash memory is a type of memory that retains stored data without a periodic refresh of electricity. An important feature of a flash memory is that it can be erased in blocks instead of one byte at a time. Each erasable block of memory comprises a plurality of non-volatile memory cells (cells) arranged in rows and columns. Each cell is coupled to a word line, bit line and source line. In particular, a word line is coupled to a control gate of each cell in a row, a bit line is coupled to a drain of each cell in a column and the source line is coupled to a source of each cell in an erasable block. The cells are programmed, read and erased by manipulating the voltages on the word lines, bit lines and source lines.

The voltage level needed to program or erase a non-volatile memory cell can be has high as 12 volts or more. Since an external Vcc power supply to a flash memory is typically 1.8 volts or lower, internal charge pumps are used in the flash memory to provide the required voltage. The internal charge pump is used to boost the external Vcc power supply voltage to a required voltage. Traditionally, charge pumps do not support high current loads, hence the resistive load of the charge pump must be kept at a minimum. Accordingly, charge pump circuits typically incorporate a capacitive voltage divider instead of a resistance voltage divider. For reliable operation of a flash memory, a well regulated charge pump is required. However, typical capacitors used in a voltage divider circuit of an integrated flash memory tend to not be as stable or precise as desired which have a negative effect on the reliability of the charge pump circuit.

For the reasons stated above, and for other reasons stated below which will become apparent to those skilled in the art upon reading and understanding the present specification, there is a need in the art for a flash memory architecture having a charge pump circuit that incorporates a voltage divider with stable and precise capacitors.

SUMMARY OF THE INVENTION

The above-mentioned problems with memory devices and other problems are addressed by the present invention and will be understood by reading and studying the following specification.

In one embodiment, a capacitor is disclosed. The capacitor comprises a poly silicon layer, a second metal layer and a first metal layer. The first metal layer is positioned between the poly silicon layer and the second metal layer. The first metal layer has a first terminal and a second terminal. Moreover, the first terminal is electrically isolated from the second terminal.

In another embodiment, a capacitor is formed in an integrated circuit that comprises a first metal layer, a second metal layer and a poly silicon layer. The first metal layer has a first terminal and a second terminal. The first and second terminals each have a base strip and a plurality of side strips that extend from their respective base strip. The side strips of the first terminal are positioned in between the side strips of the second terminal so that the first and second side strips are alternately positioned between the first and second bases of the respective first and second terminals. In addition, the first terminal is electrically isolated from the second terminal. Moreover, the first metal layer is positioned between the poly silicon layer and the second metal layer.

In another embodiment, a voltage divider comprises a first and second capacitor. The first capacitor has a second terminal that is selectively coupled to a voltage supply. The second capacitor has a first terminal coupled to a first terminal of the first capacitor. The second capacitor further has a second terminal coupled to ground. The first and second capacitors include a first metal layer forming the first and second terminals. The first and second terminals each have a base strip and a plurality of side strips that extend from the respective base strip. In addition, the side strips of the first terminal are positioned in between the side strips of the second terminal so that the first and second side strips are alternately positioned between the first and second bases of the respective first and second terminals. Moreover, the first terminal is electrically isolated from the second terminal. The first and second capacitors also include a second metal layer and a poly silicon layer. The first metal layer is positioned between the poly silicon layer and the second metal layer.

In another embodiment, a charge pump circuit comprises a charge pump, a first and second capacitor, a first, second and third transistor, a differential amplifier and a AND gate. The charge pump provides an output voltage signal. The first capacitor has a first and second terminal. The second capacitor also has a first and second terminal. The first terminal of the second capacitor is coupled to the first terminal of the first capacitor. Each of the first and second capacitors include, a poly silicon layer, a second metal layer, and a first metal layer. The first metal layer is positioned between the poly silicon layer and the second metal layer. The first metal layer has a first terminal and a second terminal. The first terminal is electrically isolated from the second terminal. The first transistor is coupled to selectively couple the second terminal of the first capacitor to the output signal of the charge pump. The second transistor is coupled between the second terminal of the first capacitor and ground. The third transistor is coupled between the first terminals of the first and second transistors and ground. Gates of the first, second and third transistors are coupled to a reset signal. The differential amplifier has a first input coupled to the first terminals of the first and second capacitors and a second input coupled to a voltage reference. The AND gate has a first input coupled to an output of the differential amplifier and a second input coupled to a clock pulse. An output of the AND gate is coupled to an input of the charge pump.

In another embodiment, a non-volatile memory device comprises a memory array, control circuitry, an address register, an input/output buffer and a charge pump. The memory array has a plurality of non-volatile memory cells to store data. The control circuitry is used to control memory operations to the memory array. The address register is used to selectively couple address requests to the memory array. The input/output buffer is used to smooth out data flowing to and from the memory array. The charge pump circuit is used to boost voltage levels during select memory operations. The charge pump circuit has capacitors. Each capacitor includes a poly silicon layer, a second metal layer and a first metal layer. The first metal layer is positioned between the poly silicon layer and the second metal layer. The first metal layer has a first terminal and a second terminal. In addition, the first terminal is electrically isolated from the second terminal.

In another embodiment, a flash memory system comprises a processor, a memory array, control circuitry, an address register, an input/output buffer and a charge pump. The processor is used to provide external data. The memory array is used to store the external data. The control circuitry is used to control memory operations to the memory array. The control circuitry coupled to receive control commands from the processor. The address register is used to selectively couple address requests to the memory array. The input/output buffer is used to smooth out data flowing to and from the memory array. The charge pump circuit is used to boost voltage levels during select memory operations. The charge pump circuit includes a first and second capacitor. Each capacitor includes a first metal layer, a second metal layer and a poly silicon layer. The first metal layer forms first and second terminals. The first and second terminals each have a base strip and a plurality of side strips that extend from the respective base strip. The side strips of the first terminal are positioned in between the side strips of the second terminal so that the first and second side strips are alternately positioned between the first and second bases of the respective first and second terminals. The first metal layer is positioned between the poly silicon layer and the second metal layer.

A method of forming a capacitor comprising, forming a poly silicon layer, forming a first metal layer over the poly silicon layer, fabricating the first metal layer to form a first terminal and a second terminal, wherein the first terminal is electrically isolated from the second terminal and forming a second metal layer over the first metal layer.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and the equivalents thereof.

Figure 1:
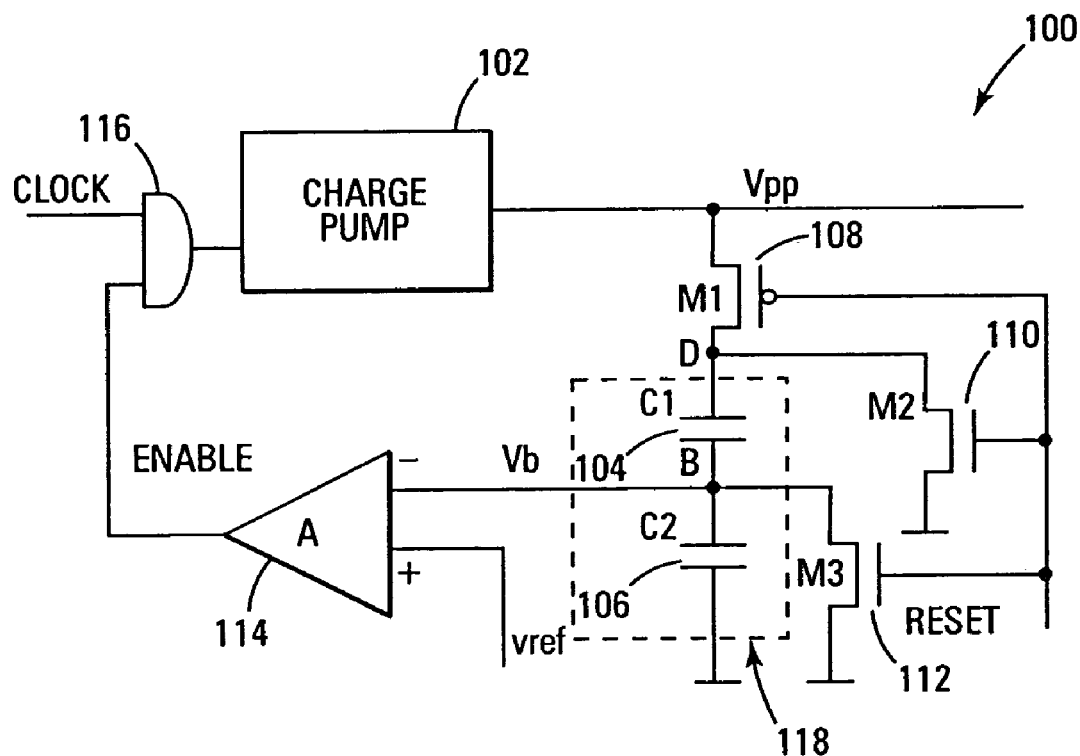
FIG. 1 is a schematic diagram of a charge pump circuit of the prior art.

The present invention provides stable and precise capacitors in a charge pump circuit to produce a stable voltage supply. Before a detailed description of the present invention is given, further background is first provided to aid the reader in under standing the present invention. Referring to FIG. 1 a charge pump circuit 100 of the prior art is illustrated. The charge pump circuit 100 of FIG. 1 is used to control output voltage Vpp of charge pump 102. The charge pump circuit 100 is based on a simple negative feedback circuit using a capacitive voltage divider (instead of a resistive voltage divider in order to reduce the current load of the pump.) Capacitors 104 (C1) and 106 (C2) make up a capacitive voltage divider 118. N-channel MOS transistors 108 (M1), 110 (M2) and 112 (M3) provide a reset of the voltage divider. A differential amplifier 114 is also provided. The voltage at node B is Vb=Vpp*C1/(C1+C2). Vref is a reference voltage generated on a chip by a dedicated circuit (not shown). Enable is the output signal of the differential amplifier 114. An AND gate 116 is provided to selectively pass a clock signal. The clock signal is needed by the charge pump 102 to generate Vpp from Vcc (the chip power supply).

At power up, a short reset signal is generated by a circuit (not shown) that completely discharges capacitors 104 (C1) and 106 (C2). The reset is needed to insure the correct operation of the capacitive voltage divider 118. Otherwise, 104 (C1) and 106 (C2) would be charged to an incorrect voltage at the onset of the operation. The reset is accomplished by turning off transistor 108 (M1) and turning on transistor 110 (M2) and transistor 112 (M3). This provides a discharge path to nodes B and D while isolating Vb from Vpp.

In normal operation, 108 (M1) is on and 110 (M2) and 112 (M3) are off. If Vpp decreases from its nominal value, Vb also tends to decrease which causes the enable signal to go to an active high state thereby allowing more clock pulses to pass through the AND gate 116 to the charge pump 102. Due to the increase of clock pulses to the charge pump 102, Vpp is increased thereby compensating for its initial decrease. Vpp is regulated at a value given by the following equations:

$Vpp=Vb*(1+C2/C1)$ or $Vpp=Vref*(1+C2/C1)$

Both equations are easily derived by the definition of the divided voltage Vb and by the consideration that the input voltages of the differential amplifier are substantially equal.

Figure 2:
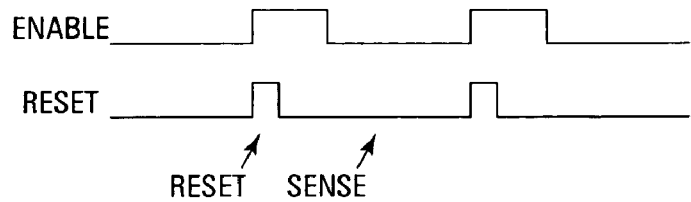
FIG. 2 is a timing diagram of a reset signal and enable signal for a charge pump circuit of the prior art.

More specifically in normal operation, even without and load applied to Vpp, leakage associated with node B tends to discharge node B to ground thereby lowering Vb below Vref. As a consequence, the differential amplifier 114 turns on, the enable signal goes active high, clock pulses are coupled to the charge pump 102 and Vpp increases to compensate for the leakage loss of charge on node B. To insure proper operation of the voltage divider 118, a short reset pulse is generated by a circuit (not shown) on the rising edge of the enable signal, as illustrated in FIG. 2. This short reset pulse resets the capacitive voltage divider 118. Grounding node B during the reset does not harm the operation, since the enable signal is already high. As soon as the reset signal ends, Vb goes to its nominal divided value and the differential amplifier 114 starts sensing the voltage at node B.

Capacitors 104 (C1) and 106 (C2) of the voltage divider 118 of FIG. 1, are sized taking into account the ratio C2/C1, which gives the desired Vpp. They cannot be sized too big or an excessive capacitive load will be placed on the charge pump 102, likewise, they cannot be sized too small or they may discharge to quickly. In order to integrate capacitors 104 (C1) and 106 (C2) into a flash memory chip, designers typically use available components usually found in a typical flash memory technology. Otherwise, it would be very expensive to generate extra process steps just to build the capacitors needed for the voltage divider 118. Moreover, for space reasons, the capacitors must occupy the least amount of silicon area as possible. In modern flash technology, an amount of silicon area occupied by a typical capacitor is in the range of 200 um2/pf.

Figure 3:
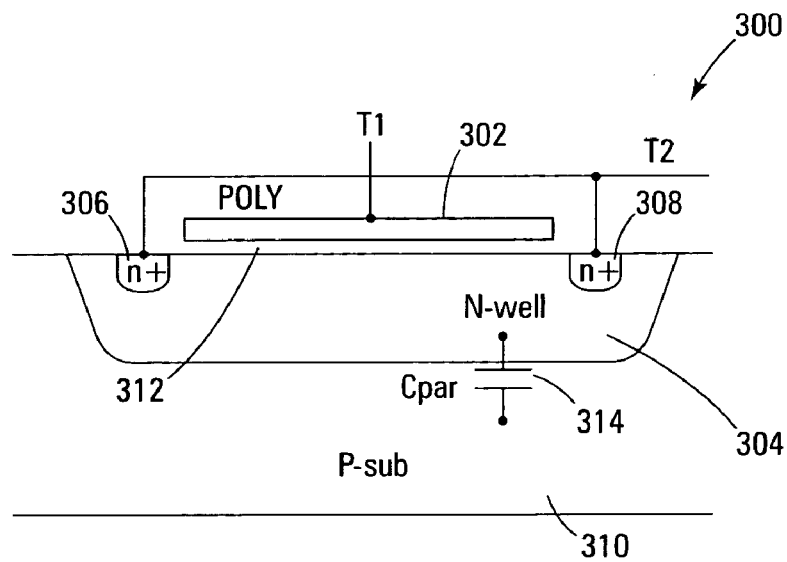
FIG. 3 is a cross-sectional view of a capacitor formed in an integrated circuit of the prior art.
Figure 3A:
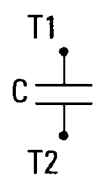
FIG. 3A is a schematic diagram of a capacitor of the prior art.

Typically, a capacitor 300 in flash memory chip is built with a poly silicon area 302 positioned on top of a N-well region 304, as illustrated in FIG. 3. The N-well region 304 is formed in a P-substrate 310 of the flash memory chip. As illustrate in FIG. 3, the poly 302 is the first terminal T1 of the capacitor 300. A pair of n+ regions 306 and 308 are formed in the N-well region 304 to form two contacts. These contacts are the second terminal T2 of the capacitor 300. A thin dielectric layer 312 is positioned between the poly 302 and the N-well 304. A common type of dielectric layer 312 used is silicon oxide having an approximate thickness of 30 Å. The "N" and "n" denote a N type of donor impurity and the "P" denotes a P type donor impurity. The "−" denotes a low donor impurity density and the "+" denote a high donor impurity density. A schematic representation of T1 and T2 of capacitor 300 is shown in FIG. 3A.

Figure 4:
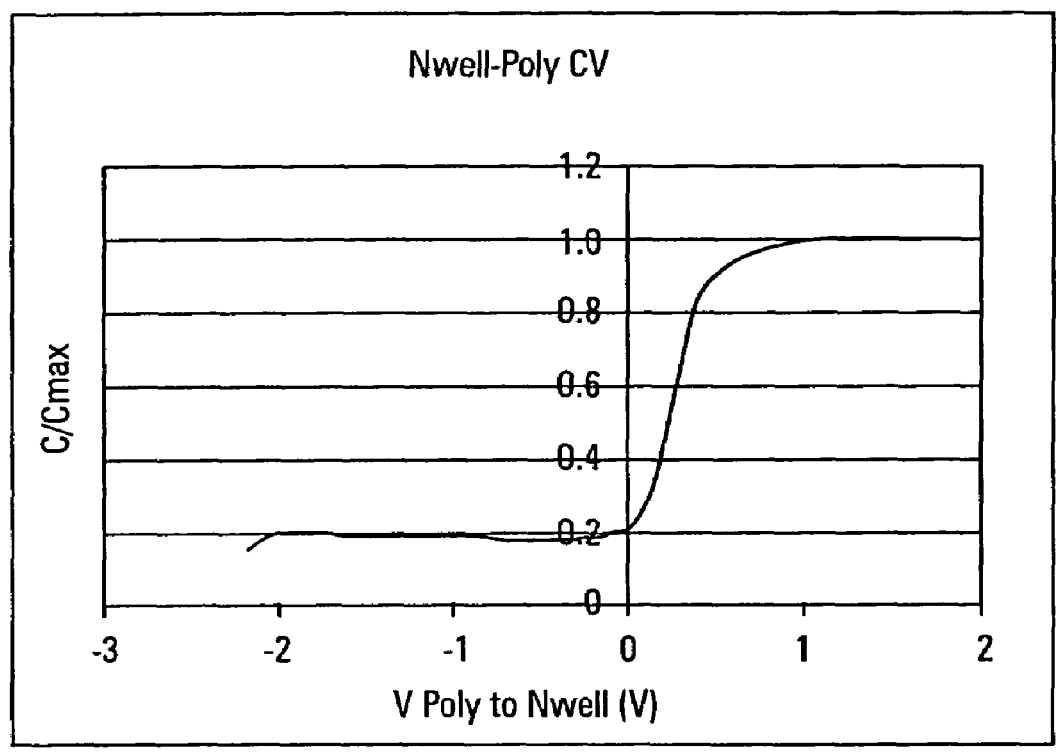
FIG. 4 is a graph illustrating the non-linear characteristics of a capacitor of the prior art.

One problem with the capacitor illustrated in FIG. 3 is that it is not linear. This is illustrated in the table of FIG. 4. In particular, as T1 becomes positive verses T2, the N-well region 304 just below the poly 302 becomes more and more populated by electrons. This reduces the electric equivalent distance between the two terminals of the capacitor thereby increasing the capacitance. Moreover, as T2 becomes positive versus T1, the N-well region 304 below the poly 302 starts to be depleted of electrons. This may cause the capacitor to become inverted resulting in a decrease in capacitance.

In addition to the non-linearity, there typically is a spread of values of capacitance due to both the varying thickness of the dielectric layer 312 and the spread of the doping in the N-well region 304 approximate the surface of the dielectric layer 312. Since, the divided voltage Vb depends from the value of the C2/C1 ratio, not by the value of a single capacitor, and since the voltage across C1 and C2 are generally not the same, C1 and C2 may work at different point of their non-linier C-V characteristics and suffer from the related uncontrollable spread of capacitance values. Another issue encountered in the capacitor 300 of FIG. 3 is parasitic capacitance Cpar 314 that occurs between the N-well 304 and the P-substrate 310. In building a voltage divider, T1 must always be more positive than T2. Otherwise the capacitance becomes to low due to the non-linearity. Hence, when putting two capacitors in series, the intermediate node (node B in FIG. 1) is affected by Cpar 314.

The non-linearity, the spread and the additional leakage, all contribute to lower the precision of the regulated charge pump. The problems all stem from the variability and the instability of the distance d in the classic formula of the capacitor, C=εS/d. Where ε is the dielectric constant of the insulator, S is the surface area of the insulator between the 2 terminals and d is the distance between the two terminals. While the location of terminal T1 in the poly 302 in FIG. 3 is fixed, the position of the N-wells 306 and 308 that form terminal T2 may vary, hence the distance d may vary. Therefore, the capacitance of FIG. 3 may vary because of the inherent nature of the semiconductor design.

There are other means to integrate a capacitor into an integrated flash memory to avoid the aforementioned problems. For example, a metal over poly capacitor or a first metal over a second metal capacitor could be used. However, the distance d in these examples is almost two orders of magnitude higher. The most convenient method to integrate a capacitor may be to use an inter-level silicon oxide sandwiched between a first metal and a second metal layer. However, such a capacitor would occupy an area of a range of 13,000 um2/pf. That is 65 times the area occupied by the poly/gate oxide/N-well capacitor of FIG. 3. Moreover, in this design stray capacitance is somewhat difficult to control thereby affecting the precision of the divider. A more effective means for integrating a capacitor into an integrated flash memory would be to use a stack structure of a poly silicon layer, a first metal layer and a second metal layer. Although, with this design the stray capacitance could be minimized by connecting the first metal of C1 with the first metal of C2 in a divider circuit, the silicon area of such a structure would be about 8000 um2/pf, which is 40 times that of the poly/gate oxide/N-well capacitor of FIG. 3.

In modern integrated circuits, including integrated flash memory circuits, the distance between two adjacent lines or layers of metals used to form the integrate circuits have been scaled down. As a result, the parasitic capacitance between the adjacent metal lines or layers has increased. The present invention takes advantage of this by using the parasitic capacitance to build a voltage divider.

Figure 5:
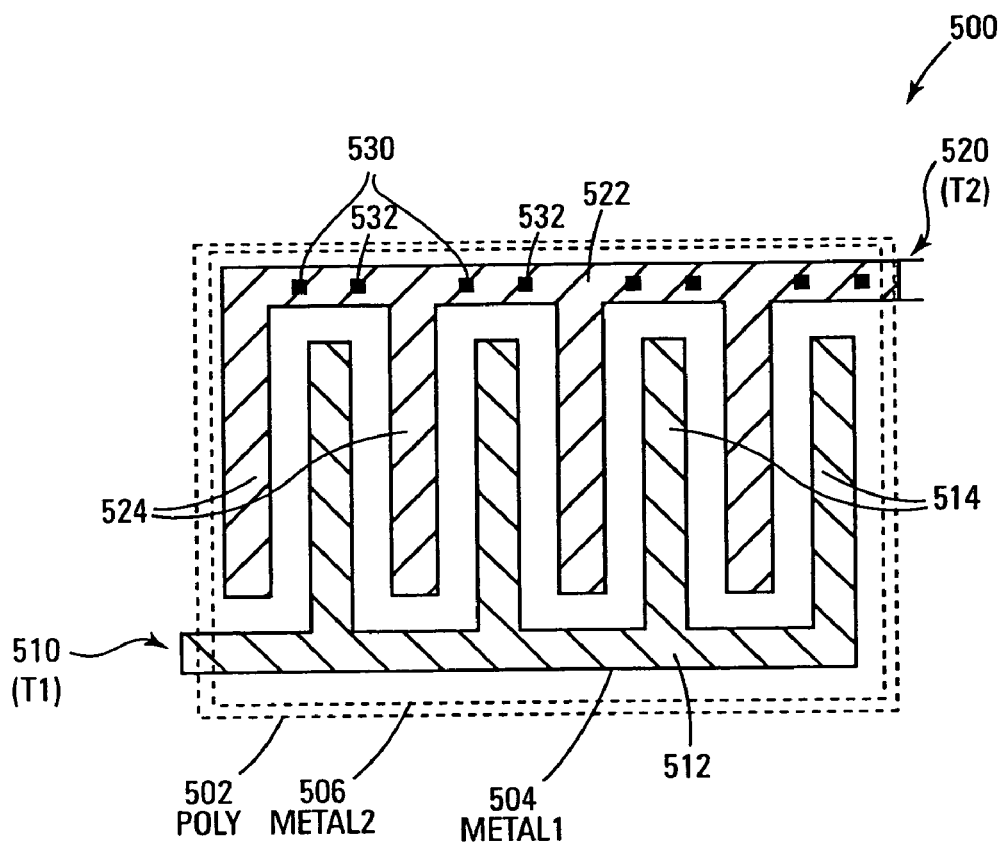
FIG. 5 is cross-sectional top view of the first metal layer of one embodiment of the present invention.

Referring to FIG. 5, a cross-sectional top view of one embodiment of a capacitor 500 of the present invention is illustrated. As illustrated, the capacitor 500 is made in the layers of material used to make the integrated circuit. In particular, the capacitor 500 is made in a poly silicon layer 502, a first metal layer 504 and a second metal layer 506. The first and second metal layers 504 and 506 are made of conducting metals including, but limited to, copper, aluminum, gold and silver. Moreover, FIG. 5 specifically illustrates the cross-sectional top view of the first metal layer 504. As illustrated, the first metal layer 504 is fabricated to form a first terminal 510 (T1) and a second terminal 520 (T2). The first terminal 510 (T1) is electrically isolated from the second terminal 520 (T2).

The first terminal 510 (T1) is formed into a first base strip 512 and a plurality of first side strips 514. The first side strips 514 extend from one side of the first base strip 512. In one embodiment, the first side strips 514 extend generally perpendicular from the first base strip 512. The second terminal 520 (T2) is formed into a second base strip 522 and a plurality of second side strips 524. The second side strips 524 extend from the second base strip 522. In one embodiment, the second side strips 524 extend generally perpendicular from the second base strip 522. The first side strips 514 of the first terminal 510 (T1) are positioned in between the second side strips 524 of the second terminal 520 (T2) so that the first and second side strips 514 and 524 are alternately positioned between the first base strip 512 and the second base strip 522. The poly silicon layer 502 is coupled to the second terminal 520 (T2) with a plurality of poly-T2 contacts 530 (first contacts 530). In addition, the second metal layer 506 is also coupled to the second terminal 520 (T2) by a plurality of second metal-T2 contacts 532 (second contacts 532). In one embodiment, the poly-T2 contacts 530 and the second metal-T2 contacts 532 are coupled to the second base strip 522 of the second terminal 520 (T2).

Figure 5A:
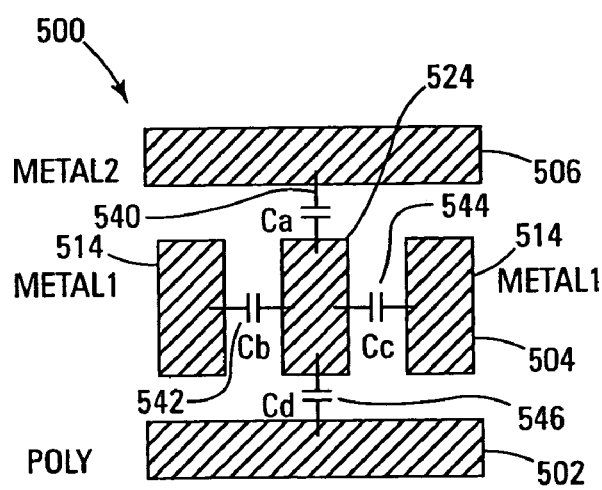
FIG. 5A is a cross sectional side view of one embodiment of the present invention.

A cross-sectional side view of one embodiment of the capacitor 500 of the present invention is illustrated in FIG. 5A. As illustrated, the first metal layer 504 is positioned between the poly silicon layer 502 and the second metal layer 506. The capacitance of capacitor 500 is the sum of the parasitic capacitance as illustrated by 540(Ca), 542(Cb), 544(Cc) and 546(Cd) of FIG. 5A. The silicon area of capacitor 500 in an integrated flash memory circuit is about 6000 um2/pf. Although, this is about 30 times the area of the poly/gate oxide/N-well capacitor of FIG. 3, it is less than 50% the size of a conventional first metal/silicon oxide/second metal capacitor. In addition, the capacitor of the present invention is about 25% the size of a stacked structure of poly silicon/first metal/second metal. Moreover, capacitor 500 of the present invention is a relatively stable and precise capacitor. In addition, as integrated circuits become more and more scaled down, the distance between side strips 514 and 524 will be decreased. This will cause the capacitance of 542 (Cb) and 544 (Cc) to become more predominate thereby making the advantages of the present invention more evident.

Figure 6:
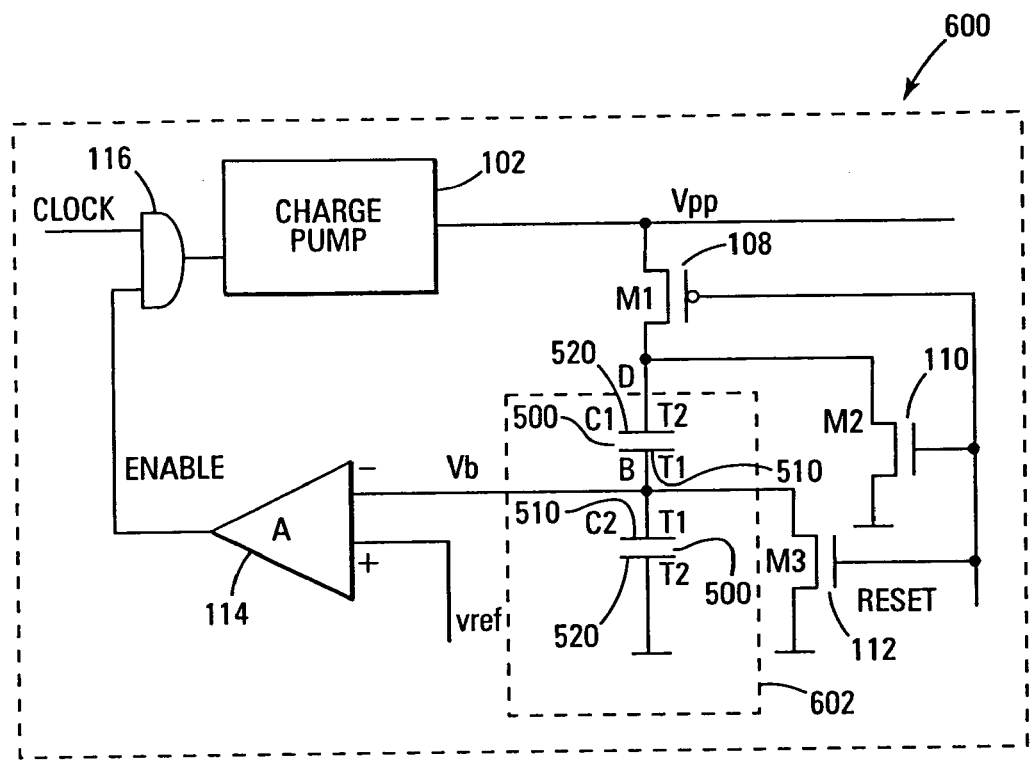
FIG. 6 is a schematic diagram of a charge pump circuit of one embodiment of the present invention.

A schematic diagram of a charge pump circuit 600 of one embodiment of the present invention is illustrated in FIG. 6. When coupling two capacitors 500 of the present invention to create a voltage divider 602, the first terminal 510 (T1) of a first capacitor 500 (C1) is coupled to the first terminal 510 (T1) of a second capacitor 500 (C2). The stray capacitance of capacitor 500 (C2) associated with the second terminal 520 (T2) is coupled to ground as shown. Moreover, stray capacitance associated with the second terminal 520 (T2) of capacitor 500 (C1) is coupled to Vpp via transistor 108 (M1).

Figure 7:
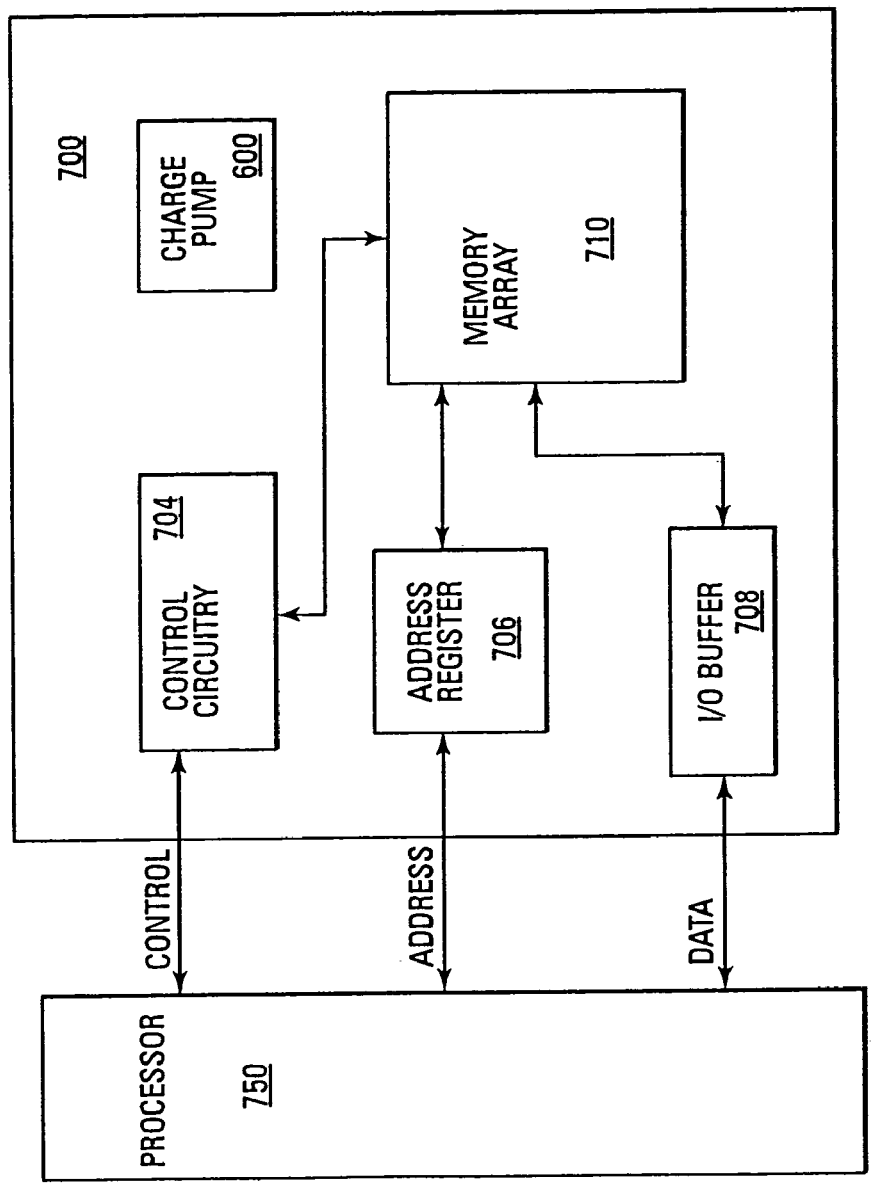
FIG. 7 is a block diagram of a flash memory of one embodiment of the present invention.

Referring to FIG. 7, a simplified block diagram of an integrated flash memory device 700 of one embodiment of the present invention is illustrated. As illustrated, the flash memory device 700 includes the charge pump circuit 600 of the present invention to provide voltages of a predetermined level to memory cells within the memory array 710 during memory operations. Control circuitry 704 is provided to control memory operations to the memory array 710. An address register 706 is used to receive address requests to memory array 710. In addition, an input/output (I/O) buffer 708 is used to smooth out the flow of data to and from the memory array 710. FIG. 7 also illustrates an exterior processor 750. Processor 750 is coupled to the control circuitry 704 to supply control commands. Processor 750 is also coupled to the address register to supply address requests. Moreover, processor 750 is coupled to the I/O buffer 708 to send and receive data.

CONCLUSION

A capacitor comprising a poly silicon layer, a first metal layer and a second metal layer has been disclosed. In one embodiment, the first metal layer is positioned between the poly silicon layer and the second metal layer. The first metal layer has a first terminal and a second terminal. The first terminal is electrically isolated from the second terminal.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:
   a memory array of non-volatile memory cells to store data;
   control circuitry to control memory operations to the memory array;
   an address register to selectively couple address requests to the memory array;
   an input/output buffer to smooth out data flowing to and from the memory array; and
   a charge pump circuit to boost voltage levels during select memory operations, the charge pump circuit having capacitors, each capacitor including,
   a contiguous poly silicon layer,
   a discontinuous first metal layer overlying the poly silicon layer, the first metal layer having a first terminal and a second terminal, wherein discontinuities in the first metal layer separate the first terminal from the second terminal so that the first terminal is electrically isolated from the second terminal, wherein the discontinuities in the first metal layer overlie and align with portions of the poly silicon layer, and
   a contiguous second metal layer overlying the first metal layer, wherein portions of the second metal layer overlie and align with the discontinuities in the first metal layer.

2. The non-volatile memory device of claim 1, wherein the second metal layer is coupled to the second terminal of the first metal layer in each capacitor.

3. The non-volatile memory device of claim 2, wherein a plurality of contacts couple the second metal layer to the second terminal of the first metal layer in each capacitor.

4. The non-volatile memory device of claim 1, wherein the first terminal of each capacitor further comprises:
   a first base strip; and
   a plurality of first side strips extending from the first base strip.

5. The non-volatile memory device of claim 4, wherein the second terminal of each capacitor further comprises:
   a second base strip; and
   a plurality of second side strips extending from the second base strip, wherein the first side strips of the first terminal are positioned in between the second side strips of the second terminal so that the first and second side strips are alternatively positioned between the first and second base strips.

6. The non-volatile memory device of claim 5, wherein the plurality of first side strips extend generally perpendicular from the first base strip and the plurality of second side strips extend generally perpendicular from the second base strip.

7. The non-volatile memory device of claim 1, wherein a plurality of contacts couple the poly silicon layer to the second terminal of the first metal layer in each capacitor.

8. A non-volatile memory device comprising:
a memory array of non-volatile memory cells to store data;
control circuitry to control memory operations to the memory array;
an address register to selectively couple address requests to the memory array;
an input/output buffer to smooth out data flowing to and from the memory array; and
a charge pump circuit to boost voltage levels during select memory operations, the charge pump circuit having capacitors, each capacitor including,
  a contiguous poly silicon layer,
  a discontinuous first metal layer positioned between overlying the poly silicon layer, the first metal layer having a first terminal and a second terminal, wherein discontinuities in the first metal layer separate the first terminal from the second terminal so that the first terminal is electrically isolated from the second terminal, wherein the discontinuities in the first metal layer overlie and align with portions of the poly silicon layer;
  a contiguous second metal layer overlying the first metal layer, wherein portions of the second metal layer overlie and align with the discontinuities in the first metal layer;
  a plurality of first contacts that couple the poly silicon layer to the second terminal of the first metal layer; and
  a plurality of second contacts that couple the second metal layer to the second terminal of the first metal layer.

9. The non-volatile memory device of claim 8, wherein the first terminal of each capacitor further comprises:
a first base strip; and
a plurality of first side strips extending from the first base strip.

10. The non-volatile memory device of claim 9, wherein the second terminal of each capacitor further comprises:
a second base strip; and
a plurality of second side strips extending from the second base strip, wherein the first side strips of the first terminal are positioned in between the second side strips of the second terminal so that the first and second side strips are alternatively positioned between the first and second base strips.

11. The non-volatile memory device of claim 10, wherein the plurality of first side strips extend generally perpendicular from the first base strip and the plurality of second side strips extend generally perpendicular from the second base strip.

12. The capacitor of claim 10 wherein the plurality of first contacts are coupled to the second base strip of the second terminal.

13. The capacitor of claim 10 wherein the plurality of second contacts are coupled to the second base strip of the second terminal.

* * * * *

UNITED STATES PATENT AND TRADEMARK OFFICE
CERTIFICATE OF CORRECTION

PATENT NO. : 7,238,981 B2 Page 1 of 1
APPLICATION NO. : 10/921463
DATED : July 3, 2007
INVENTOR(S) : Giulio Giuseppe Marotta It is certified that error appears in the above-identified patent and that said Letters Patent is hereby corrected as shown below:

Column 9, lines 21 to 22, replace " metal layer positioned between overlying " with -- metal layer overlying --.

Signed and Sealed this

Eleventh Day of December, 2007

JON W. DUDAS
*Director of the United States Patent and Trademark Office*